United States Patent [19]
Volz et al.

[11] Patent Number: 5,302,853
[45] Date of Patent: Apr. 12, 1994

[54] LAND GRID ARRAY PACKAGE

[75] Inventors: Keith L. Volz, Jamestown; Robert M. Renn, Pfafftown; Frederick R. Deak, Kernersville; David C. Johnson; Warren A. Bates, both of Winston Salem; Robert D. Irlbeck, Greensboro, all of N.C.

[73] Assignee: The Whitaker Corporation, Wilmington, Del.

[21] Appl. No.: 7,932

[22] Filed: Jan. 25, 1993

[51] Int. Cl.⁵ .............. H01L 23/02; H01L 23/12; H01L 23/42; H01L 23/44
[52] U.S. Cl. ............................ 257/707; 257/718; 257/727
[58] Field of Search .......... 257/691, 692, 700, 706, 257/707, 712, 713, 717, 718, 719, 720, 727; 361/381

[56] References Cited
U.S. PATENT DOCUMENTS

| | | | |
|---|---|---|---|
| 3,568,001 | 3/1971 | Straus | 317/101 |
| 4,390,220 | 6/1983 | Benasutti | 339/17 |
| 4,692,790 | 9/1987 | Oyamada | 357/79 |
| 4,725,922 | 2/1988 | Matsuoka | 361/392 |
| 4,744,009 | 5/1988 | Grabbe et al. | 361/398 |
| 4,760,495 | 7/1988 | Till | 361/412 |
| 4,923,404 | 5/1990 | Redmond et al. | 439/71 |
| 4,933,808 | 6/1990 | Horton et al. | 361/366 |
| 4,954,878 | 9/1990 | Fox et al. | 357/81 |
| 5,065,227 | 11/1991 | Frankeny et al. | 257/700 |
| 5,102,829 | 4/1992 | Cohn | 257/713 |

*Primary Examiner*—Sheila V. Clark
*Attorney, Agent, or Firm*—William B. Noll

[57] ABSTRACT

A combination heat sink (18, 41, 43) and circuit interface comprises a metallic wafer (15) disposed between an integrated circuit (11) and a printed circuit board (14) in a land grid array package (10). A frame (13) for the integrated circuit (11) is nested within the heat sink (18, 41, 43) and a latch (30) is pivotably mounted on the frame (13) for retaining the overall package (10). The circuit interface comprises a plurality of flexible electrical connectors (19) mounted on the wafer (15).

15 Claims, 6 Drawing Sheets

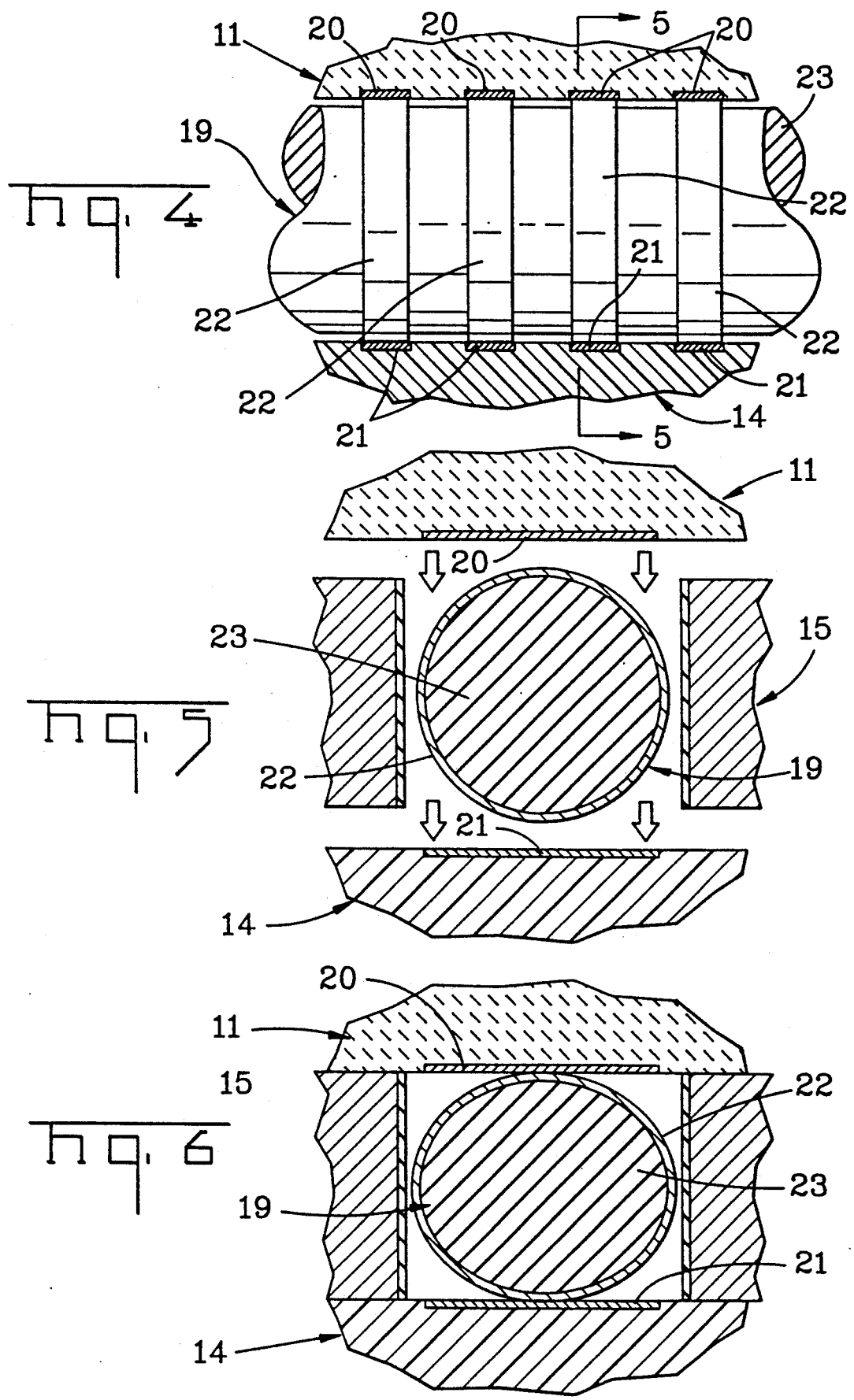

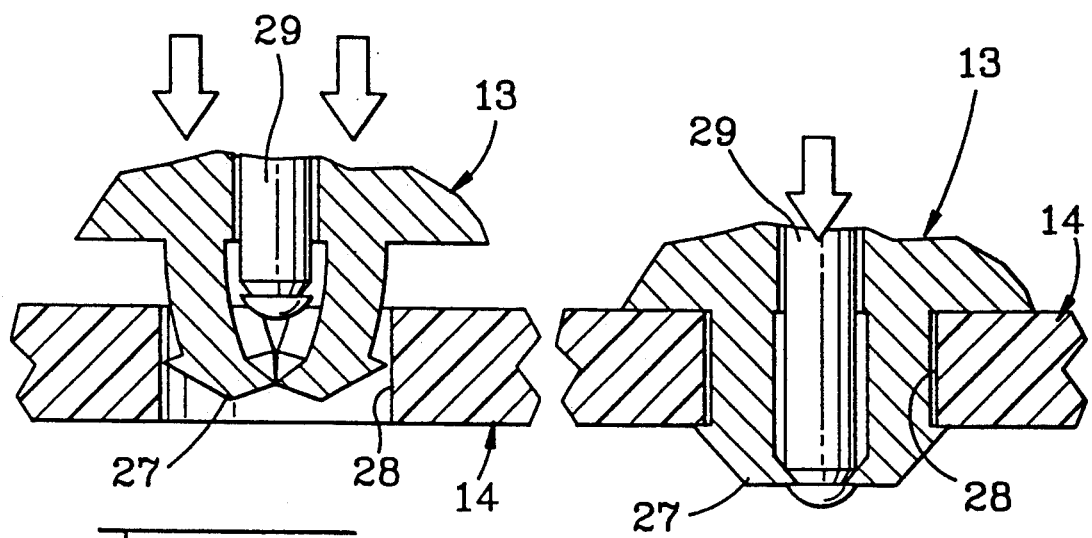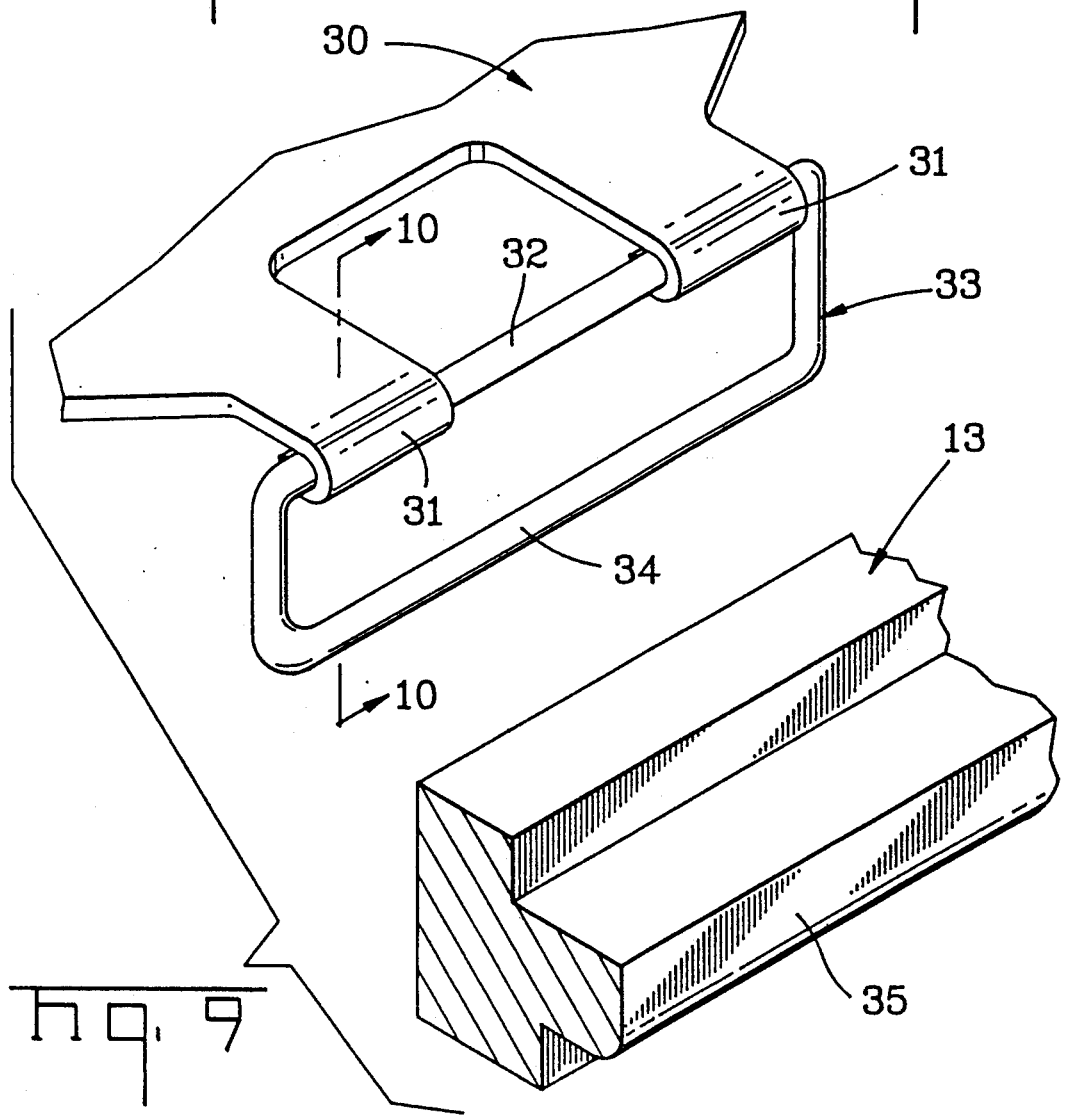

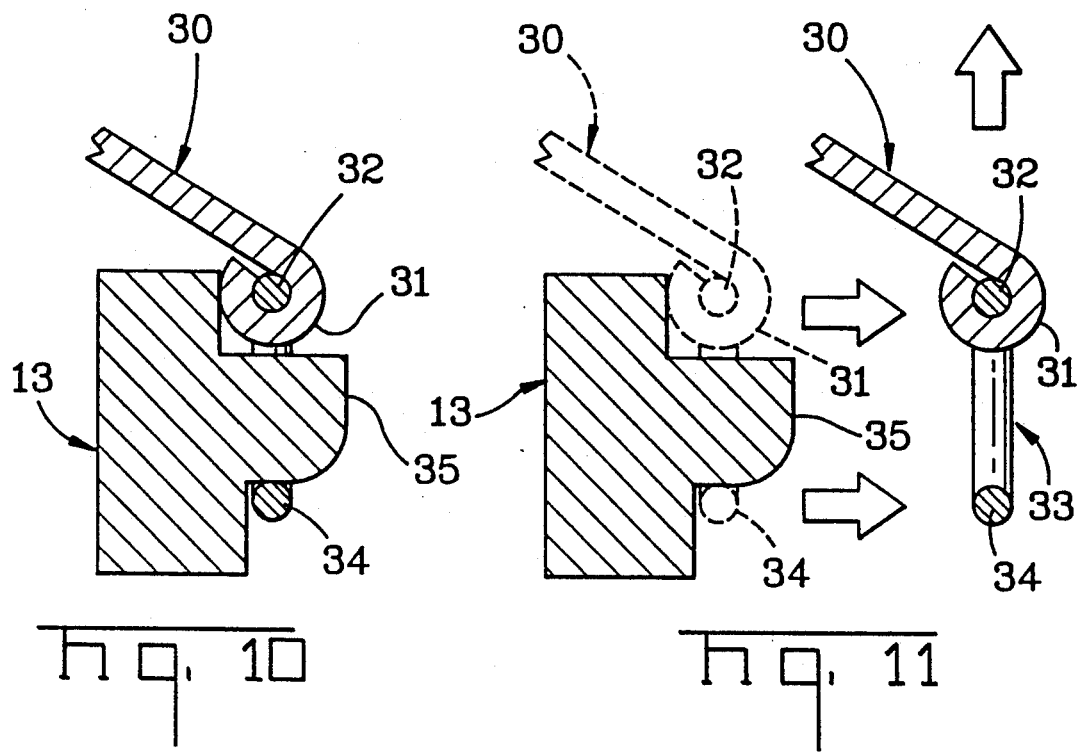
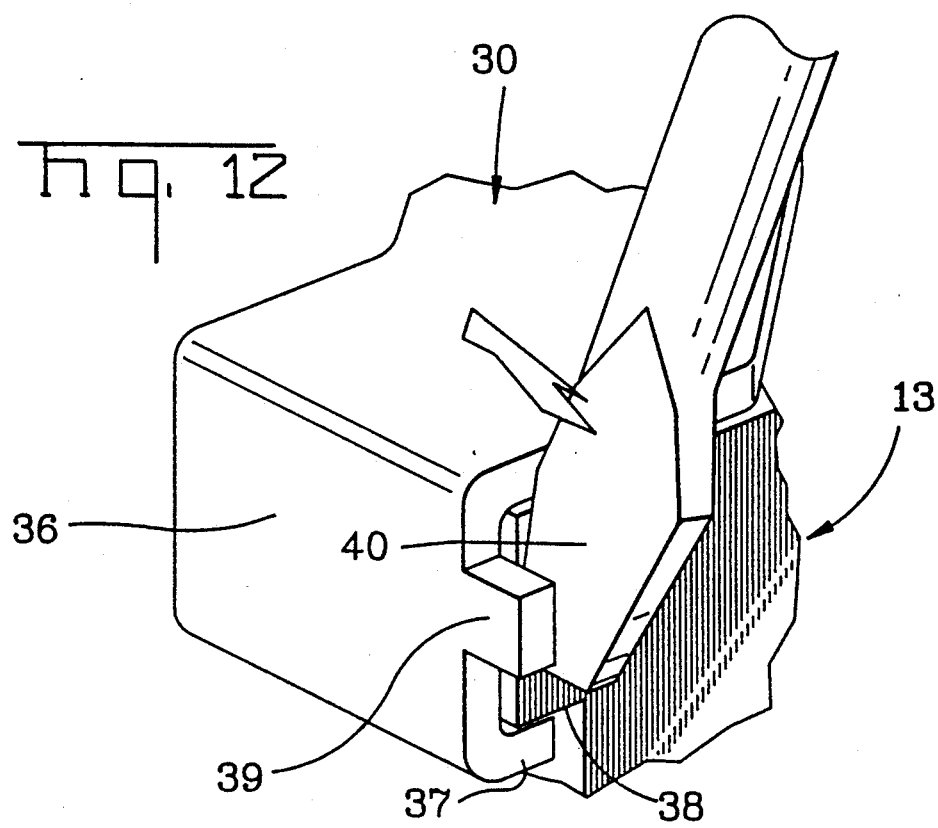

LAND GRID ARRAY PACKAGE

FIELD OF THE INVENTION

The present invention relates to a land grid array package, and more particularly, to a compact land grid array package having a combination heat sink and circuit interface.

BACKGROUND OF THE INVENTION

A land grid array (sometimes referred to in the art as an "LGA") comprises an integrated circuit widely used as an integral component in a variety of products, such as computers, business machines, telecommunication systems and the like. The overall package includes a housing or frame for the integrated circuit, a printed circuit board secured to the frame, a connector array between the integrated circuit and the printed circuit board, and a cap or latch carried by the frame for retaining the overall assembly. The integrated circuit provides a very large number of electronic circuit functions and, typically, has several hundred circuit elements or pads on a ceramic substrate of around one inch square, thereby providing a very high degree of product performance and miniaturization.

In such a high circuit density, high-performance miniaturized package, heat dissipation becomes a problem which may result in premature failure of the integrated circuit, requiring expensive replacement and servicing of the overall product or equipment. Additionally, the mechanical forces between the cooperating circuit pads on the integrated circuit and the printed circuit board, respectively, are appreciable and may require closure forces of 25 to 50 pounds for the overall package. These packages require close manufacturing tolerances, resulting in increased production costs.

SUMMARY OF THE INVENTION

Accordingly, it is an object of the present invention to provide a combination heat sink and circuit interface between the integrated circuit and the printed circuit board, thereby alleviating the problems of heat dissipation, relatively high closure forces, and close manufacturing tolerances.

The present invention constitutes an improvement to a land grid array, wherein an integrated circuit is retained in a frame mounted on a printed circuit board, and wherein the printed circuit board has respective circuit pads for selective engagement with corresponding circuit pads on the integrated circuit.

In accordance with the teachings of the present invention, a metallic wafer is disposed between the integrated circuit and the printed circuit board. This wafer has a heat sink and further has a plurality of laterally spaced-apart flexible electrical connectors between the integrated circuit and the circuit pads on the printed circuit board, thereby providing a combination integral heat sink and circuit interface (or contact wafer) for the package.

In one embodiment, the wafer is substantially rectangular and has four sides, a finger is formed integrally with each side and projects laterally therefrom, and the heat sink comprises a rectangular radiator cage secured to the respective fingers on the wafer.

In another embodiment, the heat sink comprises a plurality of upwardly-bent spaced-apart radiating fins integrally formed with the respective fingers. In each case, the frame with its integrated circuit is nested within the heat sink.

These and other objects of the present invention will become apparent from a reading of the following specification taken in conjunction with the enclosed drawings.

BRIEF DESCRIPTION OF THE DRAWINGS

FIG. 4 is a portion of FIG. 3, drawn to an enlarged scale, and showing one of the flexible electrical connectors carried on the wafer and electrically interfaced between the integrated circuit and the printed circuit board.

FIG. 5 is a cross-sectional view thereof, taken substantially along the lines 5—5 of FIG. 4, but showing the respective circuit elements in an exploded relationship.

FIG. 6 is a further cross-sectional view, corresponding substantially to FIG. 5, but showing the respective circuit elements in their assembled relationship.

FIG. 7 is an exploded cross-sectional view, taken along the lines 7—7 of FIG. 2, and showing an expandable grommet constituting one means for "snapping" the frame on to the printed circuit board.

FIG. 8 is a further cross-sectional view, corresponding substantially to FIG. 7, but showing a plunger (carried by the grommet) being depressed to expand the grommet, thereby securing the frame to the printed circuit board.

FIG. 9 is a perspective view of a portion of the frame in exploded relationship to the latch, showing a preferred means for pivoting the latch on to the frame in such a manner that the latch may be completely removed from the frame, if desired.

FIG. 10 is a cross-sectional view thereof, taken along the lines 10—10 of FIG. 9, and showing the parts assembled.

FIG. 11 corresponds to FIG. 10, but shows the latch pivoted, moved backwardly off its pivot, and removed upwardly from the frame.

FIG. 12 is a portion of FIG. 3, drawn to an enlarged scale, and showing a screwdriver blade inserted beneath a laterally-extending tab on the latch, thereby pivotably lifting the latch and releasing the latch from the frame.

GENERAL DESCRIPTION OF THE PREFERRED EMBODIMENTS

Figure 1:
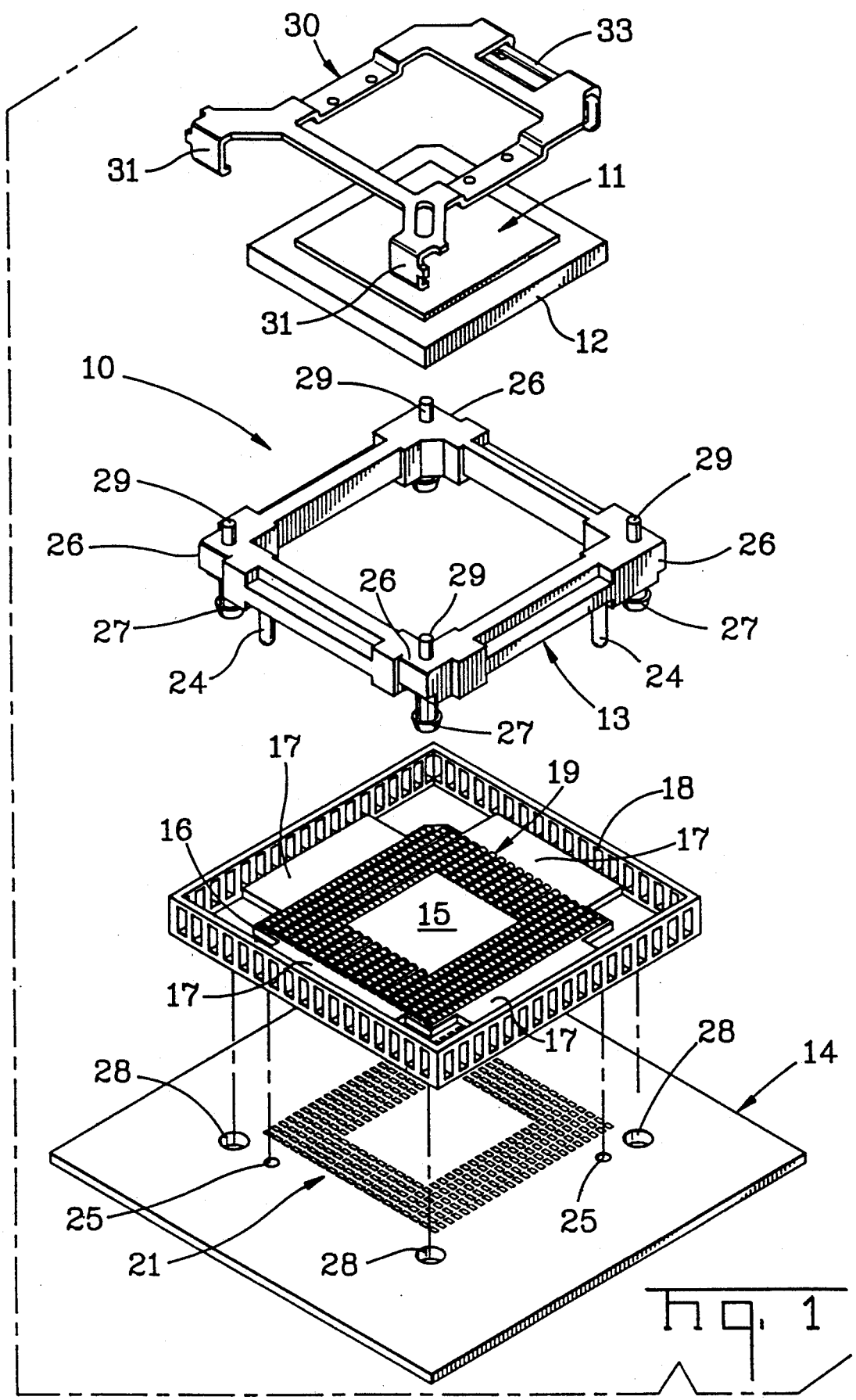
FIG. 1 is an exploded perspective view of the components of the land grid array package of the present invention, showing a preferred embodiment of the heat sink secured to a wafer, the wafer being inserted between the integrated circuit and the printed circuit board.
Figure 2:
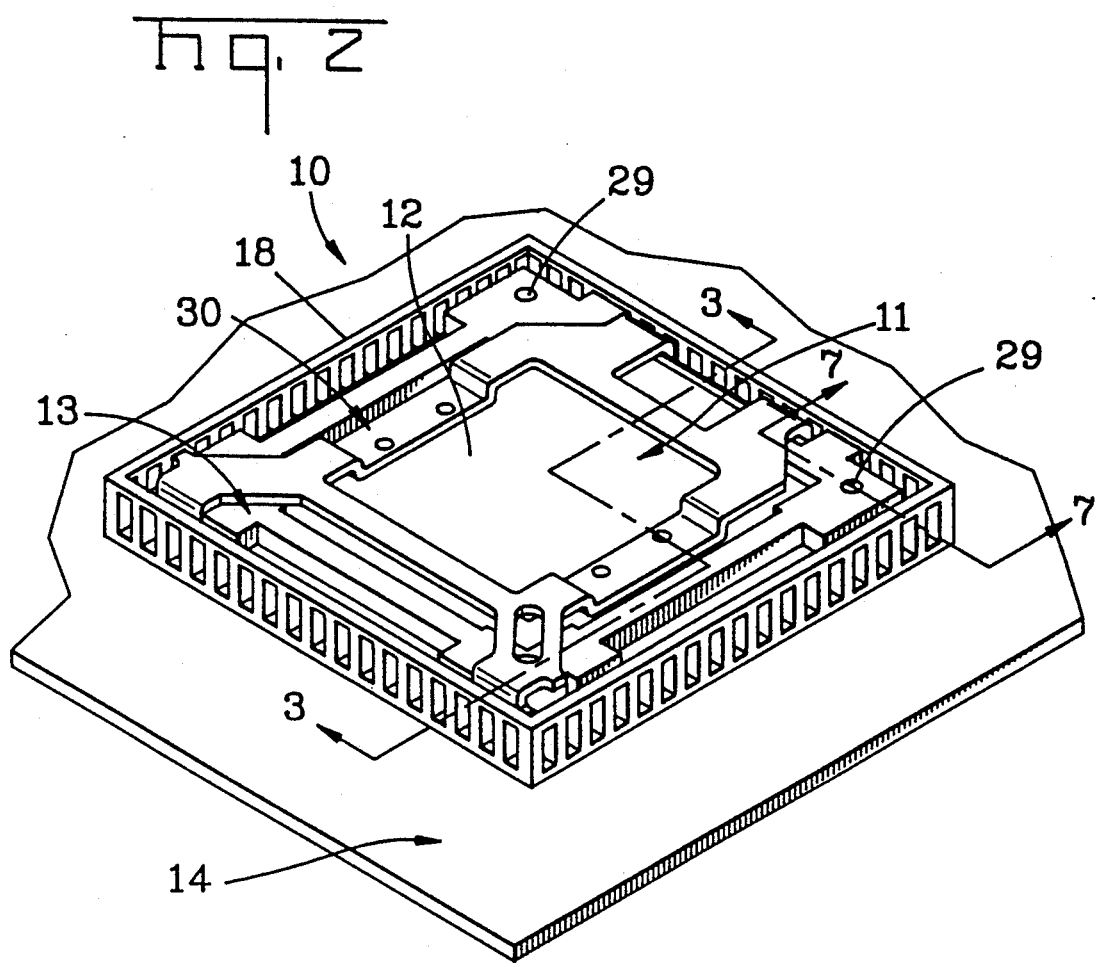
FIG. 2 is a perspective view of the land grid array package of FIG. 1 in its assembled relationship.
Figure 3:
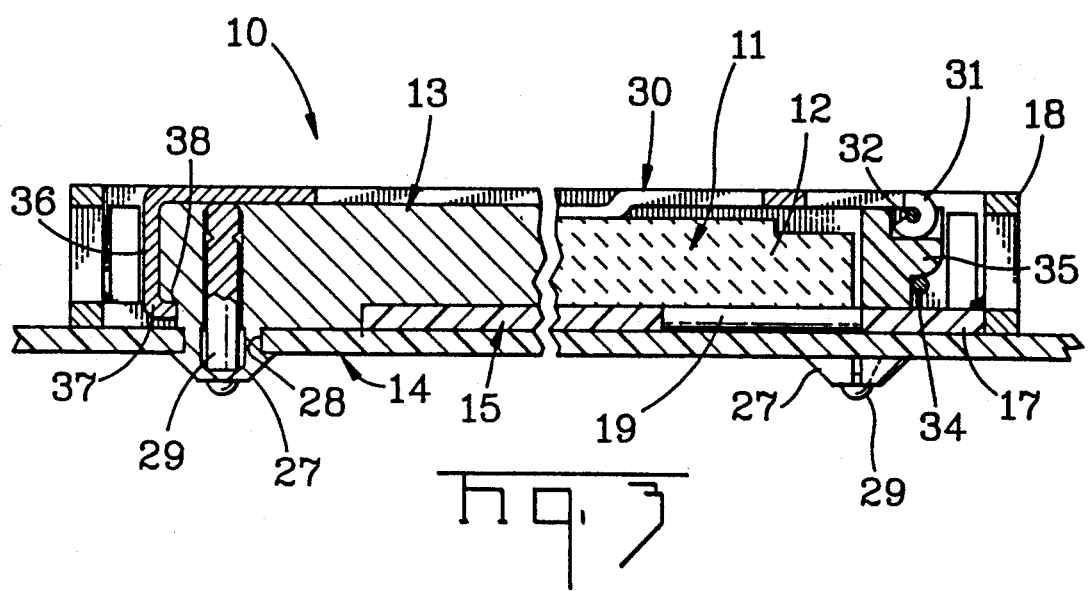
FIG. 3 is a stepped cross-sectional view thereof, taken along the lines 3—3 of FIG. 2, and showing the integrated circuit and its frame nested within the heat sink.

With reference to FIGS. 1-3, the improved land grid array 10 of the present invention includes an integrated circuit (or "chip") 11 carried on a ceramic substrate 12. The integrated circuit 11 and its substrate 12 are disposed within a housing or frame 13 which may be molded from a suitable plastic material. As hereinafter described, the frame 13 may be "snapped" on to a printed circuit board 14, and, if desired, quickly disconnected therefrom for product servicing and upgrading.

In accordance with the invention, a wafer 15 is disposed between the frame 13 and the printed circuit board 14. Preferably, the wafer 15 is metallic, being made from anodized aluminum, passivated stainless steel or other suitable metals. The wafer 15 is substantially square (or rectangular) and has four sides 16, each of which has a laterally-extending finger 17.

A heat sink 18, preferably comprising a square radiator cage, is secured to the respective fingers 17 by welding or other means. If desired, however, the heat sink 18 could be die-cast integrally with the fingers 17 on the wafer 15. The frame 13 (together with the integrated circuit 11 and substrate 12) are nested within the heat sink 18 as shown more clearly in FIG. 3.

With further reference to FIGS. 4-6, a plurality of flexible electrical connectors 19, carried by the wafer 15, provides a circuit interface between respective circuit elements or pads 20 on the integrated circuit 11 and respective circuit elements or pads 21 on the printed circuit board 14. Each flexible electrical connector 19 comprises a plurality of very finely-spaced circuit elements or traces 22 suitably mounted on an elastomeric core 23. Typically, these traces 22 are 3 mils wide with a 7 mils center-to-center spacing therebetween, resulting in a 4 mils spacing between adjacent traces 22. These traces 22 are gold-plated on a nickel-clad thin copper foil (not shown) which, in turn, is carried by a thin polymeric film. A complete line of high-quality flexible electrical connectors 19 is supplied by AMP Incorporated of Harrisburg, Pa. under its registered trademark "AMPLIFLEX".

With reference again to FIG. 1 and with further reference to FIGS. 7 and 8, the frame 13 carries a pair of downwardly-projecting alignment pins 24 received in complementary alignment holes 25 in the printed circuit board 14. Moreover, the frame 13 is preferably square (or rectangular) and has four corners 26, each of which carries an expandable latching grommet 27 received within a complementary mounting hole 28 in the printed circuit board 14. Each grommet 27 carries a pin or plunger 29; and when the plunger 29 is depressed, the grommet 27 expands to retain the frame 13 (and the overall array 10) on the printed circuit board 14, as shown more clearly in FIG. 8. If desired, however, other types of mounting means, such as bifurcated latching fingers (not shown), may be employed in lieu of the grommets 27.

With reference to FIGS. 9-11, a latch 30 is pivotably mounted on the frame 13. More specifically, latch 30 has a pair of spaced-apart curved ears 31 receiving the top leg 32 of a wire ring 33. The lower leg 34 of the wire ring 33 is lodged beneath a laterally-projecting rib 35 on the frame 13, thereby pivotably mounting the latch 30 on the frame 13. The latch 30 may be pivoted and moved rearwardly to disengage and clear the lower leg 34 of the wire ring 33 from the rib 35, and thereafter the latch 30 may be lifted upwardly and away from the frame 13, as shown more clearly in FIG. 11.

With reference again to FIGS. 1 and 3, and with further reference to FIG. 12, the latch 30 has a pair of spaced-apart downwardly-extending legs 36 opposite to the pivot axis of the latch 30. Each leg 36 has a hook formed as an inturned flange 37; and the flanges 37 are received within a pair of spaced-apart undercut shoulders 38 on the frame 13, thereby releasably retaining the latch 30 on to the frame 13 and retaining the overall assembly 10. Each leg 36 on the latch 30 further has a laterally-extending tab 39 disposed above the respective inturned flange 37. A screwdriver blade 40 (or other implement or one's finger) may be inserted below the tab 39 to lift the tab 39 outwardly and upwardly, as shown more clearly in FIG. 12, to thereby release the latch 30.

Figure 13:
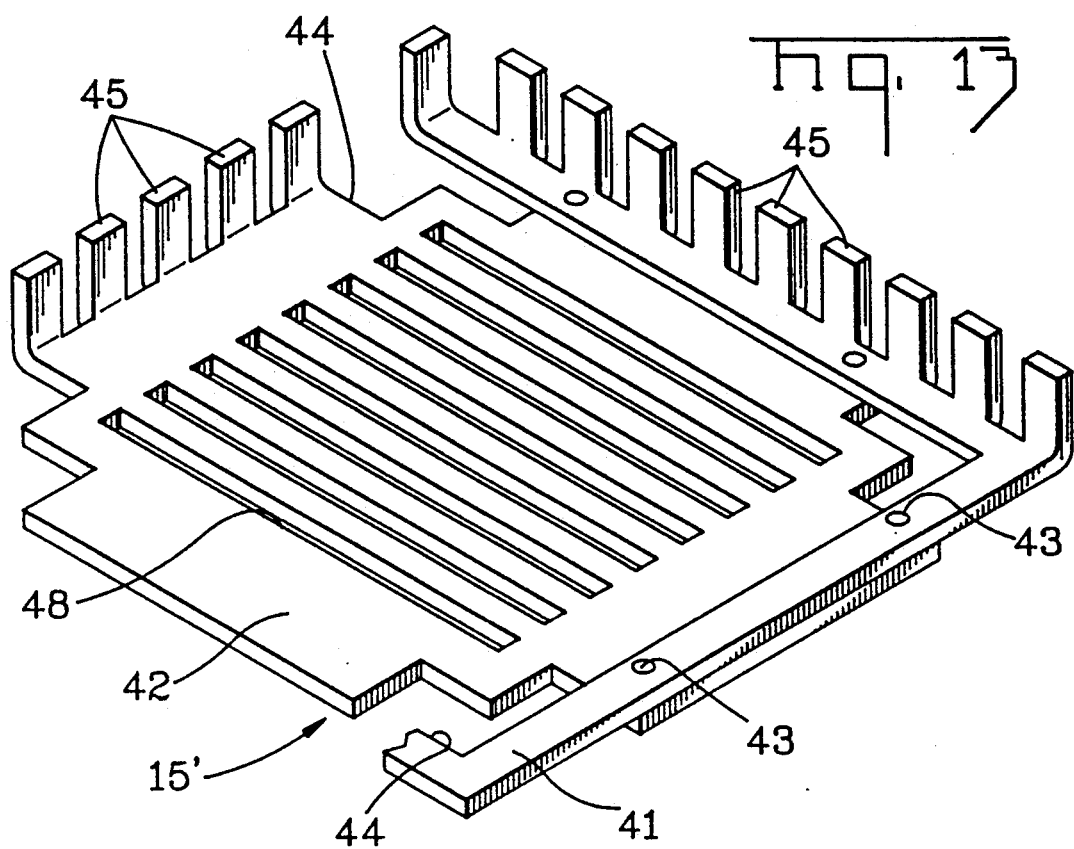
FIG. 13 is a perspective view of a first alternate embodiment of the heat sink.

With reference to FIG. 13, an alternate wafer 15' includes a pair of "hard" anodized aluminum members 41 and 42, respectively, turned substantially ninety degrees with respect to each other. The members 41, 42 are secured together, as by spot welds 43 (or other suitable means) and have respective L-shaped cut-outs 44 for mounting purposes in the overall assembly. Each of the members 41, 42 has a plurality of spaced-apart radiating fins 45 formed integrally therewith and projecting upwardly therefrom, thereby providing a heat sink.

Figure 14:
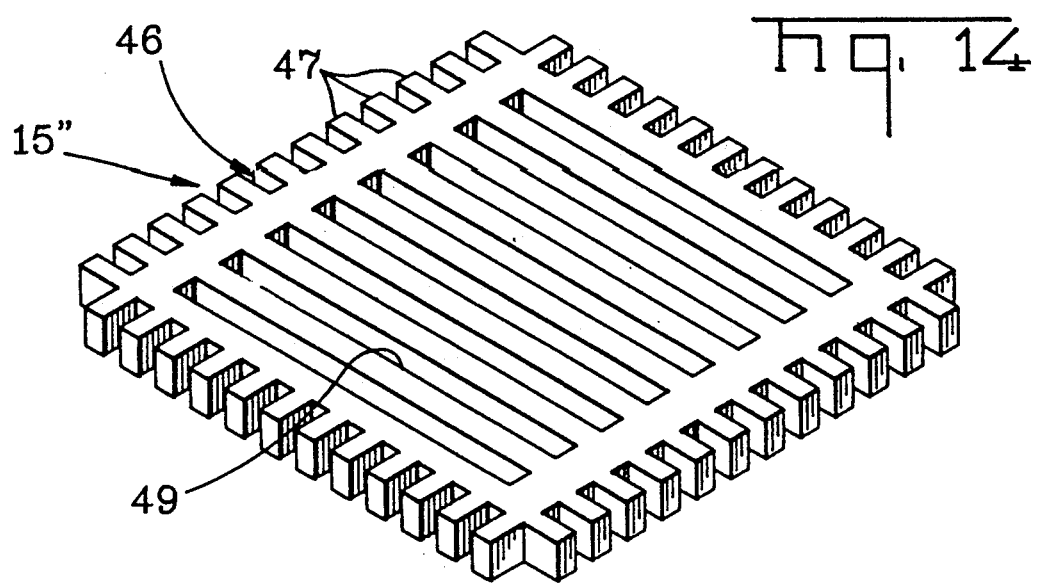
FIG. 14 is a perspective view of a second alternate embodiment of the heat sink.

With reference to FIG. 14, a second alternate metallic wafer 15", also preferably "hard" anodized aluminum, comprises a block 46 having a plurality of spaced-apart machined-out fins 47 formed integrally thereon, thereby providing a heat sink.

Channels 48 and 49 are formed in the wafers 15' and 15", respectively, to receive the flexible electrical connectors 19.

Accordingly, it will be appreciated by those skilled in the art that the unique land grid array package of the present invention has a number of very valuable features and advantages. The metallic wafer is a combined heat sink and carries the circuit interface between the integrated circuit and the printed circuit board. The heat is thus dissipated and radiated away from the integrated circuit, thereby preserving product integrity and reliability. The circuit interface on the wafer comprises a plurality of flexible electrical connectors for high circuit density and product miniaturization; these flexible electrical connectors have elastomeric cores which "cushion" the relatively-high closure forces and accommodate tolerance accumulations in the overall package. The integrated circuit is retained in a frame nested within the radiator cage on the heat sink, minimizing the overall height and providing a compact package. The frame, in turn, snaps on to the printed circuit board for ease of assembly and service. A latch is pivotably mounted on the frame and, if desired, the latch may be removed entirely from the frame.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. In a land grid array package, wherein an integrated circuit is retained in a frame mounted on a printed circuit board, and wherein the printed circuit board has respective circuit pads for selective engagement with the integrated circuit, the improvement comprising a metallic wafer between the integrated circuit and the printed circuit board, where said wafer is substantially rectangular, has four sides and a heat sink, wherein a finger is formed integrally with each side and projects laterally therefrom, and wherein the heat sink is secured to the respective fingers, said wafer further having a plurality of laterally spaced-apart flexible electrical connectors between the integrated circuit and the circuit pads on the printed circuit board, thereby providing a combination circuit interface and heat sink for the package.

2. The improvement of claim 1, wherein the heat sink comprises a rectangular radiator cage secured to the respective fingers.

3. The improvement of claim 1, wherein the heat sink comprises a plurality of upwardly-bent spaced-apart radiating fins formed integrally with the respective fingers.

4. The improvement of claim 1 wherein the wafer comprises a "hard" anodized aluminum block having a plurality of spaced-apart radiating fins formed integrally therewith.

5. In a land grid array package, wherein an integrated circuit is retained in a frame mounted on a printed circuit board, and wherein the printed circuit board has respective circuit pads for selective engagement with the integrated circuit, the improvement comprising a wafer between the integrated circuit and the printed circuit board, the wafer having a heat sink and further having a plurality of laterally spaced-apart flexible electrical connectors between the integrated circuit and the circuit pads on the printed circuit board, thereby providing a combination circuit interface and heat sink for the package, said frame being substantially rectangular and including four corners, wherein a downwardly-depending expandable mounting means is carried by each corner of the frame, and wherein the printed circuit board has respective mounting holes to receive the mounting means on the frame, such that the frame with the integrated circuit, wafer and heat sink may be snapped on to the printed circuit board.

6. In a land grid array package, wherein an integrated circuit is retained in a frame mounted on a printed circuit board has respective circuit pads for selective engagement with the integrated circuit, the improvement comprising a wafer between the integrated circuit and the printed circuit board, the wafer having a heat sink and further having a plurality of laterally spaced-apart flexible electrical connectors between the integrated circuit and the circuit pads on the printed circuit board, thereby providing a combination circuit interface and heat sink for the package, and further comprising a latch and means for pivotably mounting the latch on the frame, the latch having a pair of spaced-apart downwardly-extending legs, each of which has an inwardly-turned flange, and wherein the frame has a pair of spaced-apart undercut shoulders, each of which receives an inwardly-turned flange on a respective leg on the latch.

7. The improvement of claim 5, wherein the mounting means comprises an expandable grommet having a plunger, such that once the grommet is received in the mounting hole in the printed circuit board, the plunger may be depressed to expand the grommet and engage the printed circuit board.

8. The improvement of claim 6, wherein the means for pivotably mounting the latch on the frame comprises a pair of spaced-apart curved ears on the latch, a wire ring having a pair of substantially-parallel legs including a lower leg and further including an upper leg received within the curved ears on the latch, and the frame having a laterally-extending rib, such that the lower leg of the wire ring may be lodged beneath the rib, thereby pivotably mounting the latch on the frame, and such that the latch may be pivoted, moved away from the rib so that the lower leg of the wire ring clears the rib and, thereafter, the latch may be lifted upwardly out of the frame.

9. A land grid array package, comprising a frame having a plurality of downwardly-depending latching means, a printed circuit board having a plurality of mounting holes for the latching means, such that the frame may be snapped on to the printed circuit board, the printed circuit board having a plurality of circuit pads formed thereon, an integrated circuit mounted in the frame, a wafer between the integrated circuit and the printed circuit board, a heat sink secured to the wafer and extending upwardly therefrom to form a heat-dissipating radiator surrounding the frame, such that the frame and the integrated circuit therein are nested within the radiator, thereby providing a compact package, and a plurality of flexible electrical connectors carried by the wafer and providing a circuit interface between the integrated circuit and the circuit pads on the printed circuit board.

10. The land grid array package of claim 9, wherein the frame is molded, wherein the wafer and the heat sink are metallic, and wherein the wafer has a plurality of sides, each of which has a laterally-extending finger, the fingers being secured to the heat sink.

11. The land grid array package of claim 10, wherein each of the flexible electrical connectors comprises a plurality of circuit traces carried on an elastomeric core.

12. The land grid array of claim 9, further including a latch, means for pivotably mounting the latch on the frame, the latch having a pair of spaced-apart depending legs, each of which has an inturned flange, and wherein the frame has a pair of spaced-apart undercut shoulders, each of which receives an inturned flange on a respective depending leg on the frame, thereby releasably securing the latch to the frame.

13. The land grid array of claim 12, further including at least one laterally-extending tab on a respective leg, the tab being disposed above the inturned flange on the leg, such that an implement may be received below the tab to clear the inturned flange away from the respective shoulder, thereby releasing the latch.

14. The land grid array of claim 12, wherein the means for pivotably mounting the latch on the frame comprises a pair of spaced-apart curved ears on the latch, a wire ring having a pair of substantially-parallel legs including a lower leg and further including an upper leg carried by the curved ears, and the frame having a laterally-extending rib, such that the lower leg of the wire ring is received beneath the rib, thereby pivotably mounting the latch on the frame.

15. The land grid array of claim 14, wherein the latch may be pivoted and then moved rearwardly, such that the lower leg of the wire ring clears the rib on the frame, and such that the latch may be lifted up and out of the frame.

* * * * *